United States Patent
Mochida et al.

(10) Patent No.: US 10,488,877 B2
(45) Date of Patent: Nov. 26, 2019

(54) REGULATOR CIRCUIT AND SEMICONDUCTOR STORAGE DEVICE

(71) Applicant: Panasonic Intellectual Property Management Co., Ltd., Osaka (JP)

(72) Inventors: Reiji Mochida, Osaka (JP); Takashi Ono, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 16/122,725

(22) Filed: Sep. 5, 2018

(65) Prior Publication Data

US 2019/0004554 A1    Jan. 3, 2019

Related U.S. Application Data

(63) Continuation of application No. PCT/JP2017/008889, filed on Mar. 7, 2017.

(30) Foreign Application Priority Data

Mar. 10, 2016 (JP) ................. 2016-046375

(51) Int. Cl.
*G11C 7/00* (2006.01)
*G05F 1/575* (2006.01)
(Continued)

(52) U.S. Cl.
CPC .......... *G05F 1/575* (2013.01); *G05F 1/56* (2013.01); *G11C 5/147* (2013.01); *G11C 16/12* (2013.01); *G11C 16/30* (2013.01); *G11C 7/1078* (2013.01)

(58) Field of Classification Search
CPC .................. G11C 5/147; G05F 1/575
See application file for complete search history.

(56) References Cited

U.S. PATENT DOCUMENTS 7,068,019 B1 * 6/2006 Chiu .................. G05F 1/575
                                                323/273
2006/0119421 A1    6/2006 Kouno et al.
(Continued)

FOREIGN PATENT DOCUMENTS

JP    2006-146421 A    6/2006
JP    4237696 B2    3/2009

OTHER PUBLICATIONS

International Search Report and Written Opinion issued in International Application No. PCT/JP2017/008889 dated Apr. 11, 2017.

*Primary Examiner* — Uyen B Tran
(74) *Attorney, Agent, or Firm* — McDermott Will & Emery LLP

(57) ABSTRACT

A regulator circuit has a first non-operating state, a second non-operating state, and an operating state. The regulator circuit includes: a detection circuit that detects a magnitude of an output voltage of the regulator circuit, and outputs a feedback voltage that indicates a result of the detection to a feedback node; an operational amplifier circuit that compares the voltage of the feedback node with a reference voltage, and outputs a voltage that indicates a result of the comparison; and an output circuit that generates the output voltage according to the voltage output from the operational amplifier circuit. A state of the feedback node is different between the first non-operating state and the second non-operating state, and a transition time required to switch from the second non-operating state to the operating state is shorter than a transition time required to switch from the first non-operating state to the operating state.

14 Claims, 6 Drawing Sheets

(51) Int. Cl.
*G05F 1/56* (2006.01)
*G11C 16/12* (2006.01)
*G11C 16/30* (2006.01)
*G11C 5/14* (2006.01)
*G11C 7/10* (2006.01)

(56) References Cited

U.S. PATENT DOCUMENTS

2014/0117957 A1* 5/2014 Usuda .................... G05F 1/575
  323/280
2014/0340067 A1* 11/2014 Zhong ...................... G05F 3/08
  323/311

* cited by examiner

REGULATOR CIRCUIT AND SEMICONDUCTOR STORAGE DEVICE

CROSS REFERENCE TO RELATED APPLICATIONS

This application is a U.S. continuation application of PCT International Patent Application Number PCT/JP2017/008889 filed on Mar. 7, 2017, claiming the benefit of priority of Japanese Patent Application Number 2016-046375 filed on Mar. 10, 2016, the entire contents of which are hereby incorporated by reference.

BACKGROUND

1. Technical Field

The present disclosure relates to a regulator circuit that has a non-operating state and an operating state, and a semiconductor storage device.

2. Description of the Related Art

In a semiconductor integrated circuit, a regulator circuit is mounted in order to generate a desired internal voltage. The regulator circuit is used to, for example, generate a power supply voltage required to perform an internal operation of the semiconductor integrated circuit from an externally input power supply voltage. Also, in a semiconductor storage device, the regulator circuit is used to generate a predetermined voltage required to perform a readout operation or a write operation from an output high voltage of a charge pump circuit.

A semiconductor integrated circuit of recent years is required to have low power consumption so as to be mounted in a mobile device such as a smartphone. Accordingly, it is necessary to deactivate the regulator circuit while the semiconductor integrated circuit is in a non-operating state, and suppress power consumption during the non-operating state. At the same time, the regulator circuit is required to rapidly return from a non-operating state to an operating state so as to supply a predetermined voltage.

Japanese Patent No. 4237696 proposes a regulator circuit that is capable of rapidly returning from a non-operating state to an operating state.

However, in the conventional regulator circuit described above, because the feedback voltage is set to a voltage near the power supply voltage during the non-operating state, it requires time to make a transition from the power supply voltage to the voltage near the reference voltage in a stable operating state. This transition is desirably faster than a transition in which the regulator circuit returns from the non-operating state to the operating state.

SUMMARY

One aspect of the present disclosure solves the problem described above, and it is an object of the present disclosure to provide a regulator circuit that is capable of rapidly returning from a non-operating state to an operating state, and a semiconductor storage device.

In order to solve the problem described above, a regulator circuit according to one aspect of the present disclosure is a regulator circuit that has a first non-operating state, a second non-operating state, and an operating state. The regulator circuit includes: a detection circuit that detects a magnitude of an output voltage of the regulator circuit, and outputs a feedback voltage that indicates a result of the detection to a feedback node; an operational amplifier circuit that compares the feedback voltage of the feedback node with a reference voltage, and outputs a voltage that indicates a result of the comparison; and an output circuit that generates the output voltage of the regulator circuit according to the voltage output from the operational amplifier circuit. A state of the feedback node is different between the first non-operating state and the second non-operating state, and a transition time required to switch from the second non-operating state to the operating state is shorter than a transition time required to switch from the first non-operating state to the operating state.

Also, the first non-operating state may be a state in which the output terminal of the regulator circuit is fixed to an arbitrary voltage, and the second non-operating state may be a state in which the output terminal of the regulator circuit is in a high impedance state and the output voltage of the regulator circuit in the operating state is held.

Also, the first non-operating state may be a state in which the feedback node of the regulator circuit is connected to an arbitrary voltage, and the second non-operating state may be a state in which the feedback node of the regulator circuit is fixed to a voltage that is different from that in the first non-operating state, or the feedback voltage in the operating state is held at a high impedance.

Also, a second bias circuit may be connected to the feedback node of the regulator circuit.

Also, in the first non-operating state, the first bias circuit and the feedback node may be connected so as to supply a first bias voltage to the feedback node, and in the second non-operating state, the second bias circuit and the feedback node may be connected so as to supply a second bias voltage.

The first bias voltage may be a power supply voltage or a ground voltage, and the second bias voltage may be a reference voltage.

Also, the first bias voltage may be a power supply voltage, a reference voltage, or a ground voltage, and the second bias voltage may be a voltage close to the reference voltage.

Also, the second bias circuit may have a configuration in which a consumption current is not generated in the reference voltage such as a configuration that uses a transistor in which the reference voltage is input to the gate terminal, a current source, or a current mirror circuit, a configuration in which a voltage follower is used for the reference voltage, or a configuration in which resistors and current sources are used.

Also, the regulator circuit may make a transition to the second non-operating state after the regulator circuit has made a transition from the first non-operating state to the operating state.

As described above, with the regulator circuit and the semiconductor storage device according to one aspect of the present disclosure, the transition time required to switch from the second non-operating state to the operating state is shorter than the transition time required to switch from the first non-operating state to the operating state. Accordingly, it is possible to rapidly return from the second non-operating state to the operating state. Also, by selectively using the first non-operating state and the second non-operating state as appropriate, the return time required to return to the operating state can be shortened from an average return time.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Embodiments according to the present disclosure will be described with reference to the drawings. The embodiments described below show preferred specific examples of the present disclosure. Accordingly, the numerical values, shapes, materials, structural elements, the arrangement and connection of the structural elements, and the like shown in the following embodiments are merely examples, and therefore are not intended to limit the scope of the present disclosure. Also, among the structural elements described in the following embodiments, structural elements not recited in any one of the independent claims are described as arbitrary structural elements that constitute more preferred embodiments.

Embodiment 1

Figure 1:
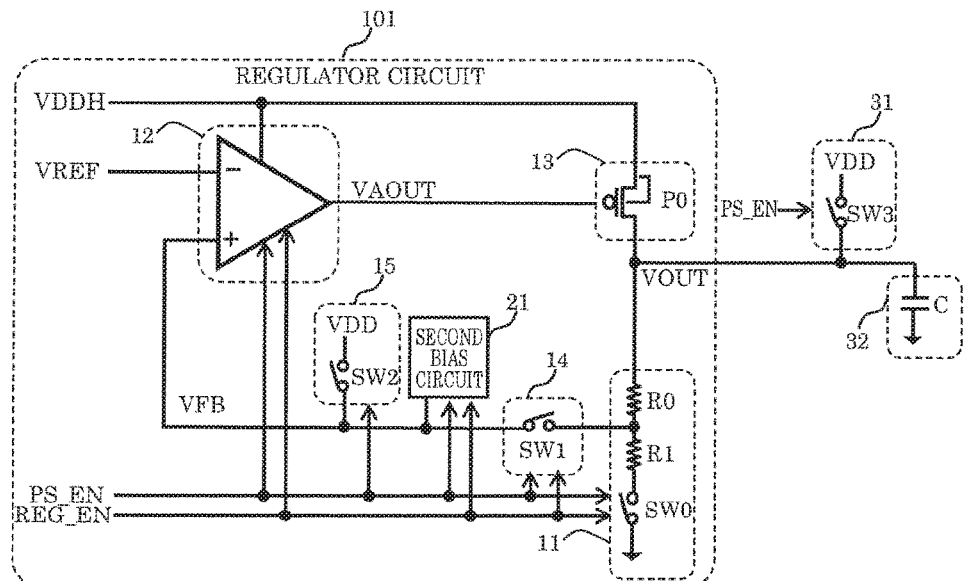
FIG. 1 is a diagram showing a configuration example of a regulator circuit according to Embodiment 1.

FIG. 1 is a diagram showing a configuration example of regulator circuit 101 according to Embodiment 1. In FIG. 1, output terminal fixing circuit 31 and smoothing capacitor 32 that are circuits attached to an output terminal of regulator circuit 101 are also shown.

Regulator circuit 101 shown in the diagram includes detection circuit 11, operational amplifier circuit 12, output circuit 13, connection disconnection circuit 14, first bias circuit 15, and second bias circuit 21. Also, regulator circuit 101 has a first non-operating state, a second non-operating state, and an operating state.

Detection circuit 11 detects output voltage VOUT, generates voltage (feedback voltage) VFB according to output voltage VOUT, and outputs generated feedback voltage VFB to a feedback node. The feedback voltage is a voltage that indicates the magnitude of output voltage VOUT. The feedback node refers to a node provided on wiring that is connected to a non-inverting input terminal of operational amplifier circuit 12.

Operational amplifier circuit 12 compares the voltage of the feedback node with reference voltage VREF, and outputs output voltage VAOUT that indicates the result of the comparison.

Output circuit 13 supplies electric current to the output terminal based on output voltage VAOUT of operational amplifier circuit 12 so as to keep output voltage VOUT constant.

Connection disconnection circuit 14 switches between connection and disconnection of an output terminal of detection circuit 11 and the feedback node.

First bias circuit 15 connects or disconnects power supply VDD to or from the feedback node.

Detection circuit 11 is constituted by a series circuit of resistors R0 and R1, and switch SW0 that are connected between output voltage VOUT and a ground voltage, and feedback voltage VFB is output from a connection point of resistors R0 and R1. Control signal PS_EN is connected to a control terminal of switch SW0.

Operational amplifier circuit 12 receives an input of feedback voltage VFB at its non-inverting input terminal, and receives an input of reference voltage VREF at its inverting input terminal. Operational amplifier circuit 12 is driven by power supply VDDH. Operational amplifier circuit 12 also receives an input of control signal PS_EN.

Output circuit 13 is composed of PMOS transistor P0. A gate terminal of PMOS transistor P0 is connected to an output terminal of operational amplifier circuit 12, a source terminal of PMOS transistor P0 is connected to power supply VDDH, and a drain terminal of PMOS transistor P0 is connected to output terminal VOUT. PMOS transistor P0 supplies electric current to the output terminal according to output voltage VAOUT of operational amplifier circuit 12.

Connection disconnection circuit 14 is composed of switch SW1, and receives an input of control signal PS_EN.

First bias circuit 15 supplies a first bias voltage as a predetermined voltage to the feedback node in the first non-operating state. The first bias voltage may be, for example, a power supply voltage or a ground voltage. FIG. 1 shows an example in which the first bias voltage is power supply voltage VDD. First bias circuit 15 is composed of, for example, switch SW2 that is connected between power supply VDD and the feedback node. Control signal PS_EN is input to a control terminal of switch SW2.

Here, control signal PS_EN is a control signal that controls activation and deactivation of regulator circuit 101. Regulator circuit 101 enters an operating state when control signal PS_EN is set to high level, and control signal REG_EN is set to high level, and enters a first non-operating state when control signal PS_EN is set to low level. Also, regulator circuit 101 enters a second non-operating state when control signal PS_EN is high level, and control signal REG_EN is set to low level. When control signal PS_EN is set to high level, switch SW0 of detection circuit 11 is turned on, switch SW1 of connection disconnection circuit 14 is turned on, switch SW2 of first bias circuit 15 is turned off, operational amplifier circuit 12 enters an active state, and regulator circuit 101 enters an operating state. When control signal PS_EN is set to low level, switch SW0 of detection circuit 11 is turned off, switch SW1 of connection disconnection circuit 14 is turned off switch SW2 of first bias circuit 15 is turned on, operational amplifier circuit 12 enters an inactive state, and regulator circuit 101 enters a first non-operating state. At this time, the current consumption of regulator circuit 101 falls to zero.

Smoothing capacitor 32 and output terminal fixing circuit 31 are connected to output terminal VOUT of regulator circuit 101. Also, control signal PS_EN is input to output terminal fixing circuit 31. Smoothing capacitor 32 is provided for the purpose of suppressing voltage variation of output voltage VOUT. Output terminal fixing circuit 31 is composed of power supply VDD and switch SW3. When control signal PS_EN is set to high level, switch SW3 of output terminal fixing circuit 31 is turned off. When control signal PS_EN is set to low level, switch SW3 of output terminal fixing circuit 31 is turned on, and power supply VDD is connected to output terminal VOUT.

Hereinafter, a case will be considered where reference voltage VREF is 0.8 V, power supply VDDH is 3.3 V, and output voltage VOUT is 2.5 V. The voltage values are an example of the case where regulator circuit 101 generates a voltage of 2.5 V that is applied to a bit line during memory writing operation. Power supply VDDH of 3.3 V is generated by a charge pump circuit increasing voltage from power supply voltage VDD of 1.1 V.

Second bias circuit 21 supplies a second bias voltage to the feedback node in the second non-operating state, the second bias voltage being different from the first bias voltage. For example, a difference between the second bias voltage and the reference voltage is set to be smaller than a difference between the first bias voltage and the reference voltage. By doing so, a transition time required to switch from the second non-operating state to the operating state will be shorter than a transition time required to switch from the first non-operating state to the operating state. Control signal PS_EN and intermittent operation control signal REG_EN are input to second bias circuit 21. Intermittent activation control signal REG_EN is also input to switch SW0 of detection circuit 11, operational amplifier circuit 12, switch SW1 of connection disconnection circuit 14, and second bias circuit 21. Here, intermittent operation control signal REG_EN is controlled in conjunction with control signal PS_EN. When control signal PS_EN is set to low, regulator circuit 101 enters a first non-operating state. When control signal PS_EN is set to high, and intermittent operation control signal REG_EN is set to high, regulator circuit 101 enters an operating state. At this time, when control signal PS_EN is set to high, and intermittent operation control signal REG_EN is set to low, the regulator circuit enters a second non-operating state. At this time, when control signal PS_EN is set to high, and intermittent operation control signal REG_EN is set to high, regulator circuit 101 makes a transition to the operating state more rapidly than when regulator circuit 101 makes a transition from the first non-operating state to the operating state.

A description will now be given of the first non-operating state and the second non-operating state. The state of the feedback node and the state of the output terminal of regulator circuit 101 are different between the first non-operating state and the second non-operating state. Specifically, the first non-operating state is a state in which the feedback node is set to a predetermined voltage (the first bias voltage). The second non-operating state is a state in which the feedback node is set to a voltage (the second bias voltage) other than the predetermined voltage, or is set to a high impedance. The output terminal of regulator circuit 101 is set to a predetermined voltage (power supply voltage VDD in FIG. 1) in the first non-operating state, and is set to a high impedance in the second non-operating state.

Figure 2:
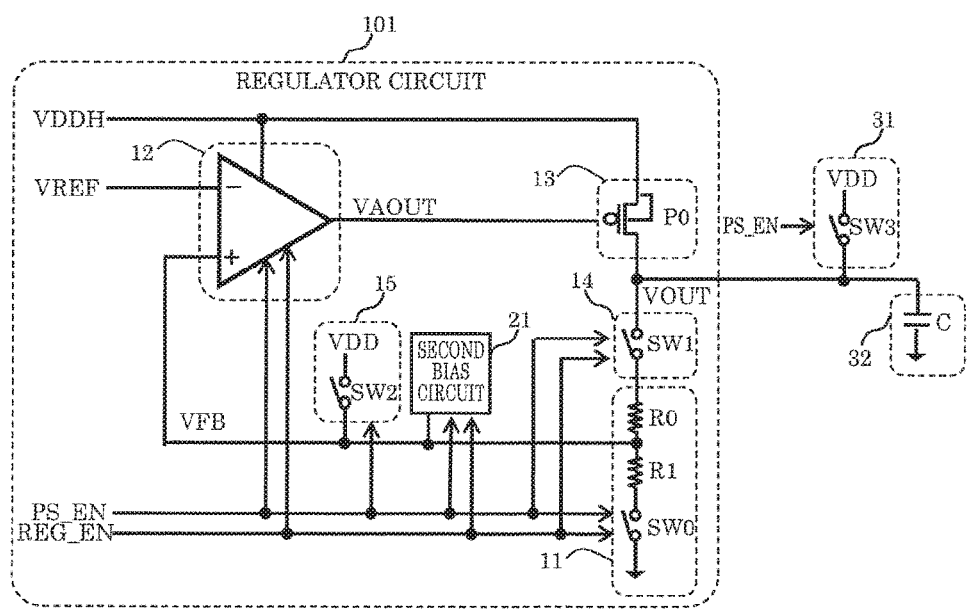
FIG. 2 is a diagram showing another configuration example of the regulator circuit according to Embodiment 1.

FIG. 2 is a diagram showing another configuration example of the regulator circuit according to Embodiment 1. As shown in FIG. 2, connection disconnection circuit 14 may be disposed between output terminal VOUT and an input terminal of detection circuit 11.

Next, Configuration Examples 1 and 2 of second bias circuit 21 will be described.

Figure 3:
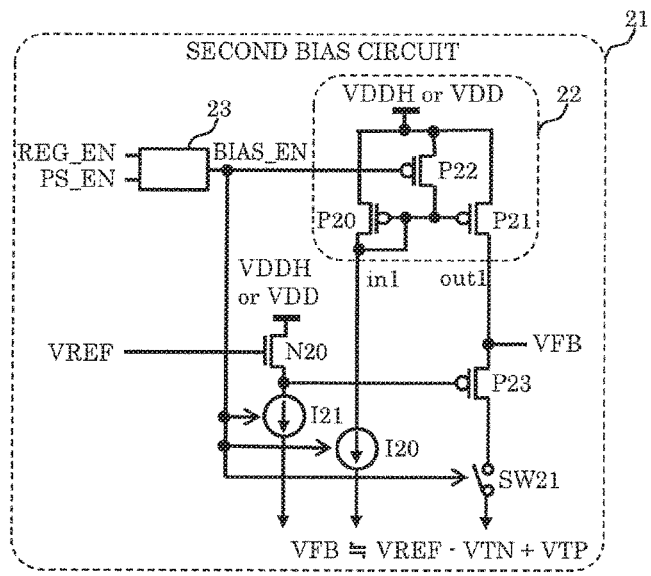
FIG. 3 is a diagram showing Configuration Example 1 of a second bias circuit according to Embodiment 1.

FIG. 3 is a diagram showing Configuration Example 1 of second bias circuit 21. Second bias circuit 21 is composed of first current source I20, second current source I21, current mirror circuit 22, NMOS transistor N20, PMOS transistor P23, switch SW21, and logic circuit 23. Input terminal in1 of current mirror circuit 22 is connected to one terminal of first current source I20, and the other terminal of the first current source is connected to a ground voltage. Also, output terminal out1 of current mirror circuit 22 is connected to the feedback node and a source terminal of PMOS transistor P23, a gate terminal of NMOS transistor N20 is connected to reference voltage VREF, a drain terminal of NMOS transistor N20 is connected to a power supply voltage such as power supply VDDH or power supply VDD, a source terminal of NMOS transistor N20 is connected to a gate terminal of PMOS transistor P23 and one terminal of second current source I21, and the other terminal of second current source I21 is connected to a ground voltage. Also, a drain terminal of PMOS transistor P23 is connected to an input terminal of switch SW21, and an output terminal of switch SW21 is connected to a ground voltage. Also, control signal PS_EN and intermittent operation control signal REG_EN are input to logic circuit 23, and logic circuit 23 outputs bias control signal BIAS_EN. Bias control signal BIAS_EN is input to first current source I20, second current source I21, switch SW21, and current mirror circuit 22. When control signal PS_EN is set to low, bias control signal BIAS_EN is set to low, and first current source I20, second current source I21, switch SW21, and current mirror circuit 22 are turned off. An output terminal of second bias circuit 21 is set to a high impedance, and the feedback node is set to the first bias voltage generated by first bias circuit 15. At this time, when control signal PS_EN is set to high, and intermittent operation control signal REG_EN is set to high, bias control signal BIAS_EN is set to low, the regulator circuit enters an operating state, and the feedback node is set to a voltage near reference voltage VREF. At this time, when control signal PS_EN is set to high, and intermittent operation control signal REG_EN is set to low, bias control signal BIAS_EN is set to high, and first current source I20, second current source I21, switch SW21, and current mirror circuit 22 are turned on. The consumption current falls to several microamperes (µA), and a value close to reference voltage VREF is output to the feedback node.

Figure 4:
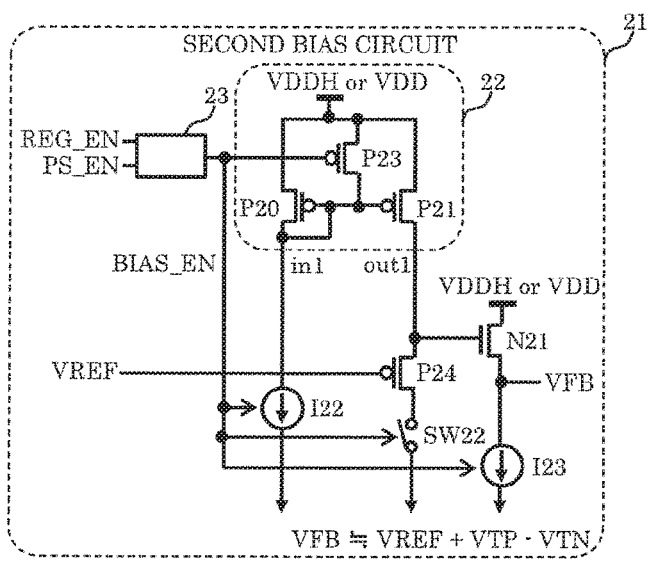
FIG. 4 is a diagram showing Configuration Example 2 of the second bias circuit according to Embodiment 1.

FIG. 4 is a diagram showing Configuration Example 2 of second bias circuit 21. Second bias circuit 21 is composed of third current source I22, fourth current source I23, current mirror circuit 22, NMOS transistor N21, PMOS transistor P24, switch SW22, and logic circuit 23. Input terminal in1 of current mirror circuit 22 is connected to one terminal of third current source I22, and the other terminal of third current source I22 is connected to a ground voltage. Also, output terminal out1 of current mirror circuit 22 is connected to a gate terminal of NMOS transistor N21 and a source terminal of PMOS transistor P24, a source terminal of NMOS transistor N21 is connected to the feedback node and one terminal of fourth current source I23, and the other terminal of fourth current source I23 is connected to ground voltage. Also, a drain terminal of NMOS transistor N21 is connected to a power supply voltage such as power supply VDDH or power supply VDD, a gate terminal of PMOS transistor P24 is connected to reference voltage VREF, a drain terminal of PMOS transistor P24 is connected to an input terminal of switch SW22, and an output terminal of switch SW22 is connected to a ground voltage. Also, control signal PS_EN and intermittent operation control signal REG_EN are input to logic circuit 23, and logic circuit 23 outputs bias control signal BIAS_EN. Bias control signal BIAS_EN is input to third current source I22, fourth current source I23, switch SW22, and current mirror circuit 22. When control signal PS_EN is set to low, bias control signal BIAS_EN is set to low, and third current source I22, fourth current source I23, switch SW22, and current mirror circuit 22 are turned off. The output terminal of second bias circuit 21 is set to a high impedance, and the feedback node is set to the first bias voltage generated by first bias circuit 15. At this time, when control signal PS_EN is set to high, and intermittent operation control signal REG_EN is set to high, bias control signal BIAS_EN is set to low, the regulator circuit enters an operating state, and the feedback node is set to a voltage near reference voltage VREF. At this time, when control signal PS_EN is set to high, and intermittent operation control signal REG_EN is set to low, bias control signal BIAS_EN is set to high, and third current source I22, fourth current source I23, switch SW22, and current mirror circuit 22 are turned on. The consumption current falls to several microamperes (µA), and a value close to reference voltage VREF is output to feedback node VFB.

Current mirror circuit 22 is composed of PMOS transistor P20, PMOS transistor P21, and PMOS transistor P23. An input terminal of current mirror circuit 22, a gate terminal and a drain terminal of PMOS transistor P20, a gate terminal of PMOS transistor P21, and a drain terminal of PMOS transistor P23 are connected. The power supply voltage such as power supply VDDH or power supply VDD is connected to PMOS transistor P20, PMOS transistor P21, and a source terminal of PMOS transistor P23. An output terminal of current mirror circuit 22 and a drain terminal of PMOS transistor P21 are connected, and bias control signal BIAS_EN is connected to a gate terminal of PMOS transistor P23.

With Configuration Examples 1 and 2 of second bias circuit 21 described above, the generation of consumption current based on reference voltage VREF is suppressed as much as possible, and it is therefore possible to suppress the occurrence of coupling noise in reference voltage VREF when the regulator circuit returns to the operating state, and shorten or reduce the time required to stabilize the reference voltage during the return time.

Second bias circuit 21 may have a configuration in which a voltage follower circuit is used for reference voltage VREF, or a configuration in which resistors and current sources are connected in series.

Various operations of regulator circuit 101 according to Embodiment 1 shown in FIG. 1 configured as described above will be described in detail below by taking an example in which regulator circuit 101 is applied to a semiconductor storage device.

Figure 5:
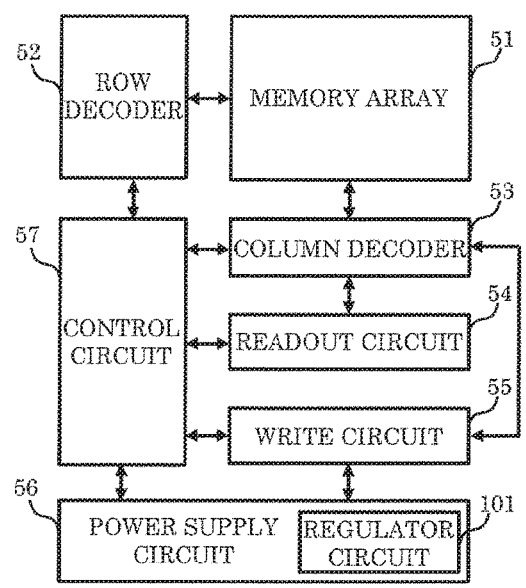
FIG. 5 is a diagram showing a configuration example of a semiconductor storage device that includes a regulator circuit.

FIG. 5 is a diagram showing a configuration example of a semiconductor storage device that includes regulator circuit 101. The semiconductor storage device includes memory array 51, row decoder 52, column decoder 53, readout circuit 54, write circuit 55, power supply circuit 56, and control circuit 57.

In memory array 51, memory cells for storing data are disposed.

Row decoder 52 is a circuit that selects a word line of memory array 51 according to an externally input address.

Column decoder 53 selects a bit line and a source line of memory array 51 according to an externally input address, and connect them to readout circuit 54 or write circuit 55.

Readout circuit 54 is a circuit that is composed of a sense amplifier or the like, and that determines data stored in the memory cells during readout operation.

Write circuit 55 is a circuit that applies a write voltage to memory array 51 during write operation.

Power supply circuit 56 is a circuit that generates a required voltage during write operation or readout operation, and supplies the generated voltage to write circuit 55, readout circuit 54, or row decoder 52. Regulator circuit 101 according to Embodiment 1 shown in FIG. 1 or 2 is incorporated in power supply circuit 56.

Control circuit 57 is a circuit that controls various types of operation modes such as reading and writing in the semiconductor storage device. Control circuit 57 controls row decoder 52, column decoder 53, readout circuit 54, write circuit 55, and power supply circuit 56 that were described above.

Figure 6:
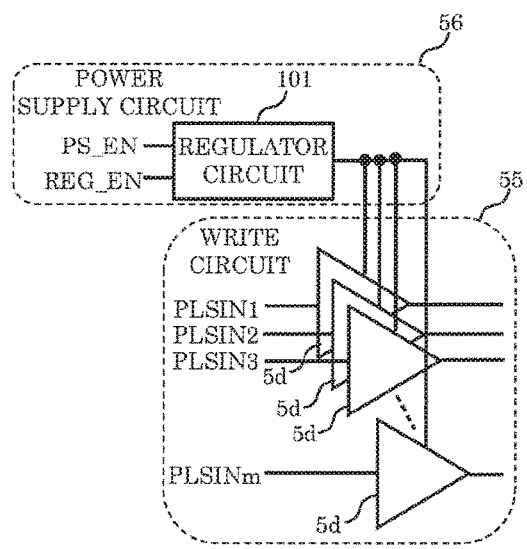
FIG. 6 is a diagram showing a configuration of a connection relationship between the regulator circuit and a write circuit.

FIG. 6 shows a connection relationship between regulator circuit 101 according to Embodiment 1 shown in FIG. 1 or 2 and write circuit 55. Write circuit 55 includes m drivers. m is, for example, the number of columns in memory array 51. The drivers are write pulse application circuits 5d that apply write pulses to the memory cells. The output terminal of regulator circuit 101 is connected to the power supply of each driver provided in write circuit 55, and regulator circuit 101 supplies a power supply voltage that corresponds to a high level of a write pulse to the drivers. The plurality of drivers provided in write circuit 55 are controlled by pulse control signals PLSIN1 to PLSINm. Each driver outputs a write pulse at a timing of input of pulse control signal PLSINi (where i is any one of 1 to m).

Figure 7:
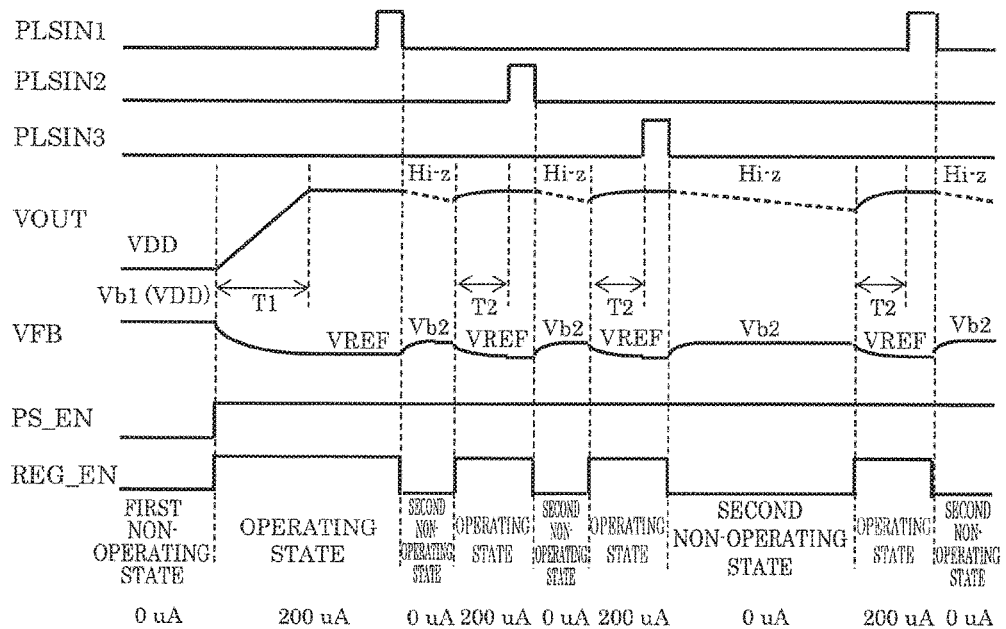
FIG. 7 is a diagram showing waveforms in various operating states of the regulator circuit according to Embodiment 1.

FIG. 7 shows waveforms according to Embodiment 1. The diagram shows waveforms when a write voltage (or in other words, a write pulse) is continuously applied in the semiconductor storage device. When control signal PS_EN is set to low, and intermittent operation control signal REG_EN is set to low, the regulator circuit enters a first non-operating state, and the output terminal outputs power supply VDD. At this time, switch SW0 of detection circuit 11 is disconnected, switch SW1 of connection disconnection circuit 14 is also disconnected, and switch SW2 of first bias circuit 15 is connected. Accordingly, feedback voltage VFB is also connected to power supply VDD. Also, operational amplifier circuit 12 enters an inactive state, the regulator circuit is deactivated, and the power consumption of the regulator circuit falls to zero.

Furthermore, when control signal PS_EN is set to high, and intermittent operation control signal REG_EN is set to high, switch SW0 of detection circuit 11 is connected, switch SW1 of connection disconnection circuit 14 is also connected, and switch SW2 of first bias circuit 15 is disconnected. Also, the operational amplifier enters an active state, the regulator circuit enters an operating state, and the output terminal outputs 2.5 V. At this time, when the output terminal becomes stable at 2.5 V, pulse control signal PLSIN1 is input, and a write pulse is applied to memory cells.

After application of the write pulse, when control signal PS_EN is high, and intermittent operation control signal REG_EN is set to low, the regulator circuit enters a second non-operating state, the output terminal is set to high impedance Hi-z, and the output voltage (2.5 V) of the operating state is held. At this time, switch SW0 of detection circuit 11 is disconnected, switch SW1 of connection disconnection circuit 14 is also disconnected, second bias circuit 21 enters an operating state, and a second bias voltage that is near reference voltage VREF is output. Accordingly, feedback voltage VFB is set to the second bias voltage that is near reference voltage VREF. Also, operational amplifier circuit 12 enters an inactive state, the regulator circuit is deactivated, and the consumption current of the regulator circuit falls to several microamperes (μA) that is the consumption current of the second bias circuit.

Furthermore, when control signal PS_EN is high, and intermittent operation control signal REG_EN is set to high, switch SW0 of detection circuit 11 is connected, switch SW1 of connection disconnection circuit 14 is also connected, and switch SW2 of first bias circuit 15 is disconnected. Also, the operational amplifier enters an active state, the regulator circuit enters an operating state, the output terminal rapidly becomes stable at 2.5 V, and pulse control signal PLSIN2 is input. At this time, because in the second non-operating state, output terminal VOUT holds the output voltage (2.5 V) of the operating state, and feedback voltage VFB also receives a supply of voltage near reference voltage VREF that is a stable operating state, transition time T2 required to transition from the second non-operating state to the operating state is shorter than transition time T1 required to transition from the first non-operating state to the operating state. In FIG. 7, transition time T1 refers to the time from the end of the first non-operating state to when the operating state becomes stable. Likewise, transition time T2 refers to the time from the end of the second non-operating state to when the operating state becomes stable.

Comparative Example

Figure 8:
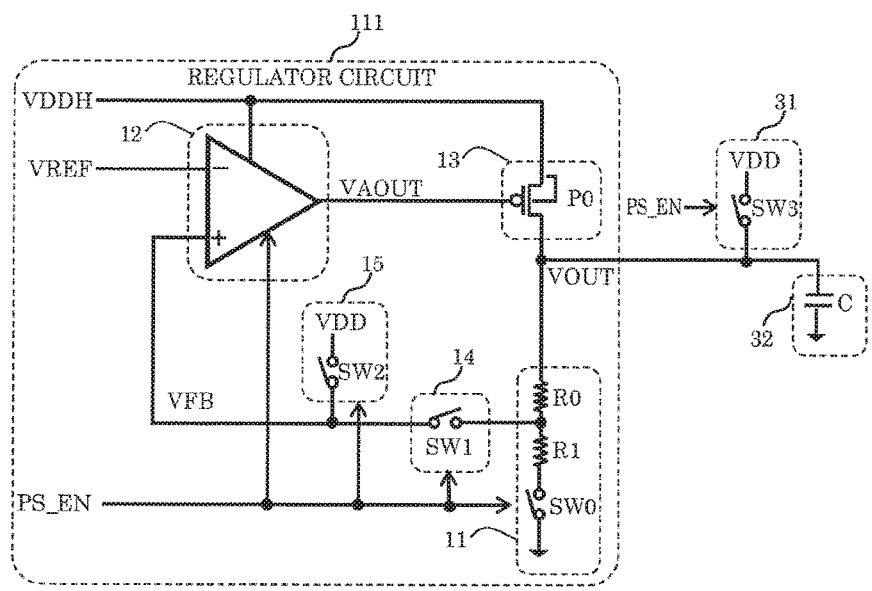
FIG. 8 is a diagram showing a configuration of a regulator circuit according to a comparative example.

Next, regulator circuit 111 according to Comparative Example will be described in comparison with regulator circuit 101 according to Embodiment 1. FIG. 8 is a diagram showing a configuration of regulator circuit 111 according to Comparative Example. Regulator circuit 111 according to Comparative Example shown in FIG. 8 is different from the regulator circuit shown in FIG. 1 in that regulator circuit 111 does not include second bias circuit 21 and signal lines of intermittent operation control signal REG_EN. Hereinafter, a description will be given focusing on the difference.

Because second bias circuit 21 and signal lines of intermittent operation control signal REG_EN are not included, the regulator circuit according to Comparative Example does not have a second non-operating state. That is, regulator circuit 111 according to Comparative Example has only one non-operating state in addition to an operating state.

Figure 9:
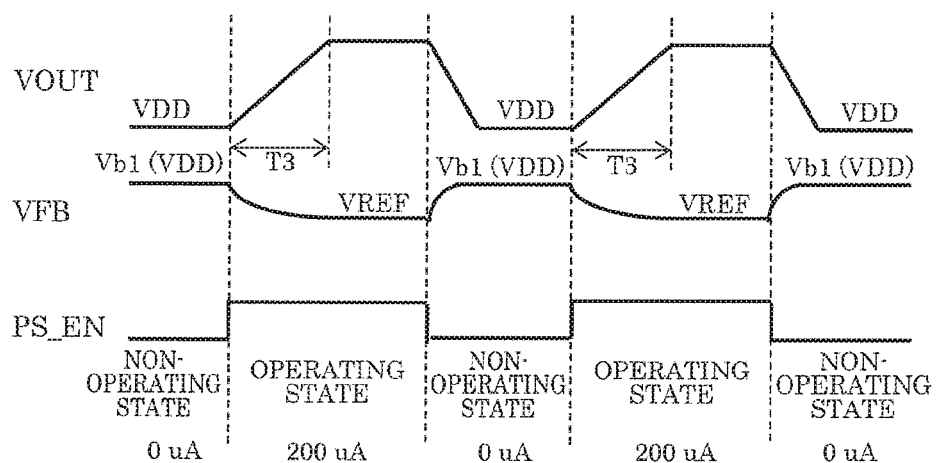
FIG. 9 is a diagram showing waveforms in various operating states of the regulator circuit according to Comparative Example.

FIG. 9 is a diagram showing waveforms in various operating states of regulator circuit 111 according to Comparative Example. As shown in FIG. 9, when control signal PS_EN is set to high level, the regulator circuit is activated (enters an operating state), and keeps output voltage VOUT constant.

On the other hand, when control signal PS_EN is set to low level, regulator circuit 111 enters a non-operating state, and the current consumption in detection circuit 11 and operational amplifier circuit 12 falls to zero. When control signal PS_EN is set to high level during the non-operating state, the regulator circuit returns from the non-operating state to an operating state, and starts supplying electric current.

As shown in FIG. 9, during the operating state, output voltage VOUT of regulator circuit 111 is 2.5 V. At this time, feedback voltage VFB that is the input voltage of operational amplifier circuit 12 is set to a value (0.8 V) that is equal to reference voltage VREF.

When control signal PS_EN is set to low level, regulator circuit 101 makes a transition to a non-operating state. At this time, the current consumption in detection circuit 11 and operational amplifier circuit 12 falls to zero. Also, output terminal VAOUT of operational amplifier circuit 12 outputs power supply VDDH, and PMOS transistor P0 of output circuit 13 is thereby turned off. At this time, switch SW3 of output terminal fixing circuit 31 is turned on, and output terminal VOUT outputs power supply VDD.

Here, the output terminal of detection circuit 11 and the feedback node are disconnected by connection disconnection circuit 14, power supply VDD is output from first bias circuit 15, and feedback voltage VFB is set to a value near power supply VDD. When control signal PS_EN is set to high level during the non-operating state, the regulator circuit returns from the non-operating state to an operating state.

As described above, regulator circuit 111 according to Comparative Example has a non-operating state that substantially corresponds to the first non-operating state of Embodiment 1, but does not have the second non-operating state.

For this reason, regulator circuit 111 according to Comparative Example cannot rapidly return from the non-operating state to the operating state. As shown in FIG. 9, feedback voltage VFB is set to a value near power supply VDD during the non-operating state, and thus a length of time corresponding to time T3 is required to transition from power supply VDD (1.1 V) to VREF (0.8 V) during stable operation. In general, power supply VDD varies widely as compared with reference voltage VREF. Accordingly, when power supply VDD is set to a value near the upper limit voltage value, the time required for feedback voltage VFB to transition from power supply VDD to VREF during stable operation further increases.

In order to prevent such a transition of feedback voltage VFB, first bias circuit 15 may be composed of reference voltage VREF and switch SW2. However, coupling noise occurs in reference voltage VREF when the regulator circuit returns from the non-operating state to the operating state, which requires time to return to the reference voltage during stable operation.

In contrast, with regulator circuit 101 according to Embodiment 1, in the second non-operating state, the feedback node is set to a value near reference voltage VREF, and it is therefore possible to make the transition time from the second non-operating state to an operating state shorter than the transition time from the first non-operating state to an operating state. Also, with regulator circuit 101, when the feedback node is set to a value near the reference voltage during the second non-operating state, a load current is not generated in the reference voltage. Accordingly, the return time can be shortened without generating noise in the reference voltage.

As described above, regulator circuit 101 according to Embodiment 1 is regulator circuit 101 that has a first non-operating state, a second non-operating state, and an operating state. Regulator circuit 101 includes: detection circuit 11 that detects a magnitude of an output voltage of regulator circuit 101, and outputs a feedback voltage that indicates a result of the detection to a feedback node; operational amplifier circuit 12 that compares the feedback voltage of the feedback node with a reference voltage, and outputs a voltage that indicates a result of the comparison;

and output circuit 13 that generates the output voltage of the regulator circuit according to the voltage output from operational amplifier circuit 12. A state of the feedback node is different between the first non-operating state and the second non-operating state, and a transition time required to switch from the second non-operating state to the operating state is shorter than a transition time required to switch from the first non-operating state to the operating state.

Here, regulator circuit 101 may generate the output voltage of the regulator circuit that corresponds to a high level of a write pulse of a semiconductor storage device that is capable of writing content to be stored into a memory cells and erasing the content stored in the memory cell by using an electric signal, and supply the output voltage of the regulator circuit to at least one write pulse application circuit that applies the write pulse to the memory cell as a power supply voltage.

Here, regulator circuit 101 may enter the operating state a predetermined period before the write pulse becomes active, and enter the second non-operating state when the write pulse becomes inactive.

Here, an output terminal of regulator circuit 101 may have a predetermined voltage in the first non-operating state, and have a state in which the output voltage of regulator circuit 101 is held at a high impedance in the second non-operating state.

Here, the first non-operating state may be a state in which the feedback node is set to a predetermined voltage, and the second non-operating state may be a state in which the feedback node is set to a voltage other than the predetermined voltage, or is set to a high impedance.

Here, regulator circuit 101 may further include: connection disconnection circuit 14 that switches between connection and disconnection of detection circuit 11 and output circuit 13, or switches between connection and disconnection of detection circuit 11 and the feedback node; first bias circuit 15 that supplies a first bias voltage to the feedback node; and second bias circuit 21 that supplies a second bias voltage to the feedback node, the second bias voltage being different from the first bias voltage.

Here, connection disconnection circuit 14 may connect detection circuit 11 and the feedback node in the operating state, and disconnect detection circuit 11 from the feedback node in the first non-operating state and the second non-operating state, first bias circuit 15 and the feedback node are connected in the first non-operating state, and second bias circuit 21 and the feedback node are connected in the second non-operating state.

Here, a difference between the first bias voltage and the reference voltage may be smaller than a difference between the second bias voltage and the reference voltage.

Here, first bias circuit 15 may include a switch that switches between supplying the first bias voltage to the feedback node and not supplying the first bias voltage to the feedback node. Second bias circuit 21 may include a voltage follower circuit that generates the second bias voltage from the reference voltage.

Here, second bias circuit 21 may include first current source I20, second current source I21, current mirror circuit 22, NMOS transistor N20, PMOS transistor P23, and switch SW21. One terminal of first current source I20 may be connected to an input terminal of current mirror circuit 22, and another terminal of first current source I20 may be grounded. An output terminal of current mirror circuit 22 may be connected to the feedback node and a source terminal of PMOS transistor P23. A gate terminal of NMOS transistor N20 may be connected to the reference voltage, a source terminal of NMOS transistor N20 may be connected to a power supply voltage, and a drain terminal of NMOS transistor N20 may be connected to a gate terminal of PMOS transistor P23 and one terminal of second current source I21. Another terminal of second current source I21 may be grounded. A drain terminal of PMOS transistor P23 may be connected to one terminal of switch SW21, and another terminal of switch SW21 may be grounded.

Here, second bias circuit 21 may include first current source I22, second current source I23, current mirror circuit 22, NMOS transistor N21, PMOS transistor P24, and switch SW22. One terminal of first current source I22 may be connected to an input terminal of current mirror circuit 22, and another terminal of first current source I22 may be grounded. An output terminal of current mirror circuit 22 may be connected to a gate terminal of NMOS transistor N21 and a source terminal of PMOS transistor P24. A source terminal of NMOS transistor N21 may be connected to a power supply voltage, and a drain terminal of NMOS transistor N21 may be connected to the feedback node and one terminal of the second current source. Another terminal of second current source I23 may be grounded. A gate terminal of PMOS transistor P24 may be connected to the reference voltage, a drain terminal of PMOS transistor P24 may be connected to one terminal of the switch, and another terminal of switch SW22 may be grounded.

Also, the semiconductor storage device according to Embodiment 1 is a semiconductor storage device that is capable of erasing data from a memory cell and writing data into the memory cell by using an electric signal. The semiconductor storage device includes: regulator circuit 101 described above; the memory cell that stores data; and write pulse application circuit that applies a write pulse to the memory cell. Regulator circuit 101 supplies the output voltage of the regulator circuit that corresponds to a high level of a write pulse to the write pulse application circuit as a power supply voltage.

Here, regulator circuit 101 may enter the operating state a predetermined period before the write pulse becomes active, and enter the second non-operating state when the write pulse becomes inactive.

Here, in a plurality of continuous writing operations, the operating state and the second non-operating state are repeated the same number of times.

Embodiment 2

Figure 10:
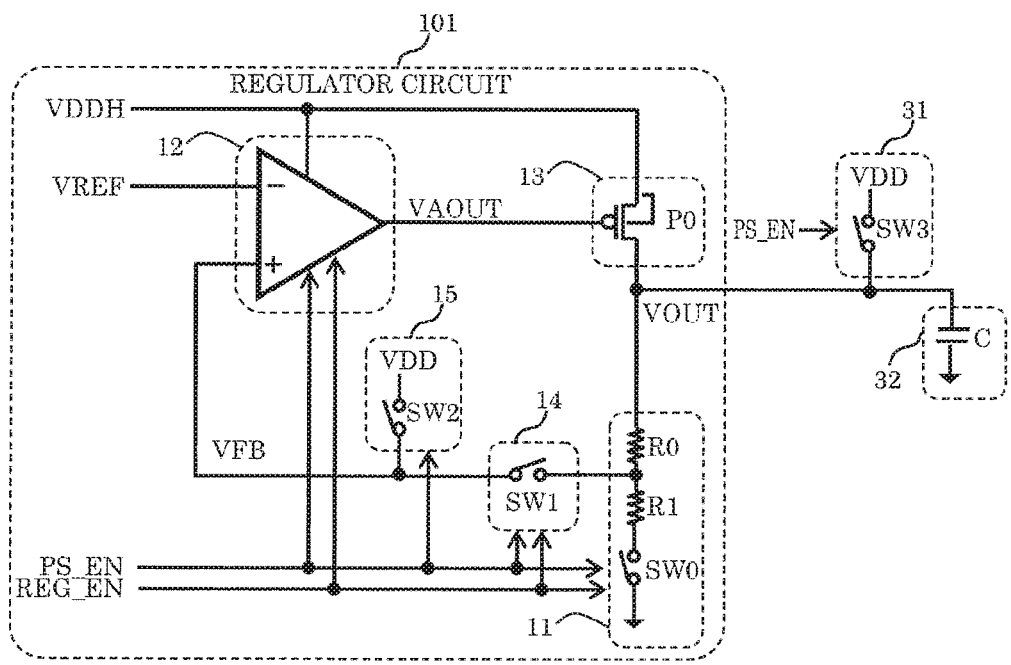
FIG. 10 is a diagram showing a configuration of a regulator circuit according to Embodiment 2.

FIG. 10 is a diagram showing a configuration of a regular circuit according to Embodiment 2. In FIG. 10, structural elements that have the same functions as those of the above-described conventional regulator circuit are given the same reference numerals, and a detailed description thereof is omitted. Only differences will be described here.

Regulator circuit 101 has intermittent operation control signal REG_EN, which is input to switch SW0 of detection circuit 11, operational amplifier circuit 12, and switch SW1 of connection disconnection circuit 14.

Various operations of regulator circuit 101 according to Embodiment 2 shown in FIG. 10 configured as described above will be described in detail below by taking an example in which regulator circuit 101 is applied to a semiconductor storage device.

FIG. 5 is a diagram showing a configuration of a semiconductor storage device, and FIG. 6 shows a connection relationship between regulator circuit 101 according to Embodiment 2 shown in FIG. 10 and write circuit 55. The configuration of the semiconductor storage device and the connection relationship between regulator circuit 101 shown in FIG. 10 and write circuit 55 are the same as those of Embodiment 1 described above. Accordingly, a detailed description thereof is omitted here.

Figure 11:
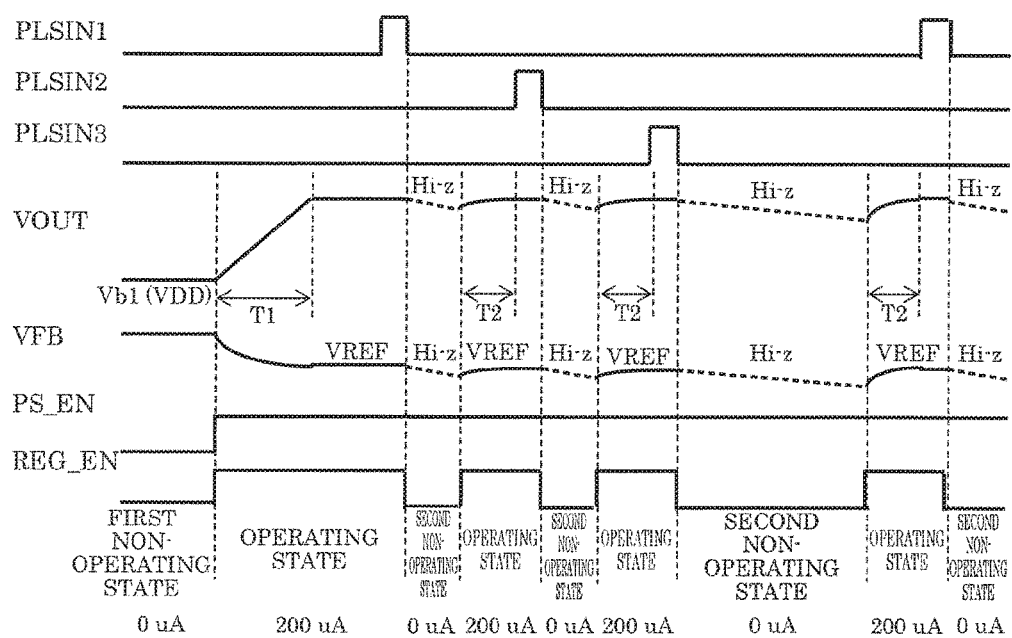
FIG. 11 is a diagram showing waveforms in various operating states of the regulator circuit according to Embodiment 2.

FIG. 11 shows waveforms according to Embodiment 2. When control signal PS_EN is set to low, and intermittent operation control signal REG_EN is set to low, the regulator circuit enters a first non-operating state, and the output terminal outputs power supply VDD. At this time, switch SW0 of detection circuit 11 is disconnected, switch SW1 of connection disconnection circuit 14 is also disconnected, and switch SW2 of first bias circuit 15 is connected. Accordingly, feedback voltage VFB is also connected to power supply VDD. Also, operational amplifier circuit 12 also enters an inactive state, the regulator circuit is deactivated, and the power consumption of the regulator circuit falls to zero. At this time, when control signal PS_EN is set to high, and intermittent operation control signal REG_EN is set to high, switch SW0 of detection circuit 11 is connected, switch SW1 of connection disconnection circuit 14 is also connected, and switch SW2 of first bias circuit 15 is disconnected. Also, the operational amplifier enters an active state, the regulator circuit enters an operating state, and the output terminal outputs a voltage of 2.5 V. At this time, when the output terminal becomes stable at 2.5 V, pulse control signal PLSIN1 is input, and a write pulse is applied to memory cells. After application of the write pulse, when control signal PS_EN is high, and intermittent operation control signal REG_EN is set to low, the regulator circuit enters a second non-operating state, and the output terminal holds the output voltage (2.5 V) of the operating state at high impedance Hi-z. At this time, switch SW0 of detection circuit 11 is disconnected, and switch SW1 of connection disconnection circuit 14 is also disconnected. Accordingly, feedback voltage VFB holds the voltage near reference voltage VREF that is feedback voltage VFB of the operating state at high impedance Hi-z. Also, operational amplifier circuit 12 enters an inactive state, the regulator circuit is deactivated, and the consumption current of the regulator circuit falls to zero.

At this time, when control signal PS_EN is high, and intermittent operation control signal REG_EN is set to high, switch SW0 of detection circuit 11 is connected, switch SW1 of connection disconnection circuit 14 is also connected, and switch SW2 of first bias circuit 15 is disconnected. Also, the operational amplifier enters an active state, the regulator circuit enters an operating state, the output terminal rapidly becomes stable at 2.5 V, and pulse control signal PLSIN2 is input. At this time, in the second non-operating state, output terminal VOUT holds the output voltage (2.5 V) of the operating state, and feedback voltage VFB also holds a voltage near reference voltage VREF that is in a stable operating state. Accordingly, transition time T2 required to transition from the second non-operating state to the operating state is shorter than transition time T1 required to transition from the first non-operating state to the operating state.

As described above, regulator circuit 101 according to Embodiment 2 is regulator circuit 101 that has a first non-operating state, a second non-operating state, and an operating state. Regulator circuit 101 includes: detection circuit 11 that detects a magnitude of an output voltage of regulator circuit 101, and outputs a feedback voltage that indicates a result of the detection to a feedback node; operational amplifier circuit 12 that compares the feedback voltage of the feedback node with a reference voltage, and outputs a voltage that indicates a result of the comparison; and output circuit 13 that generates the output voltage of the regulator circuit according to the voltage output from operational amplifier circuit 12. A state of the feedback node is different between the first non-operating state and the second non-operating state, and a transition time required to switch from the second non-operating state to the operating state is shorter than a transition time required to switch from the first non-operating state to the operating state.

Here, the first non-operating state is a state in which the feedback node is set to a predetermined voltage, and the second non-operating state is a state in which the feedback node is set to a high impedance.

With this configuration, as a result of the feedback node being set to a high impedance in the second non-operating state, the transition time required to transition from the second non-operating state to the operating state can be made shorter than the transition time required to transition from the first non-operating state to the operating state. Also, with regulator circuit 101, a load current does not occur when the feedback node is set to a high impedance in the second non-operating state, and thus the return time can be shortened without generating noise.

Although the regulator circuit and the semiconductor storage device according to the present disclosure have been described above by way of embodiments, the present disclosure is not limited to the embodiments. The present disclosure also encompasses other embodiments obtained by making various modifications that can be conceived by a person having ordinary skill in the art to the embodiments given here without departing from the scope of the present disclosure, as well as embodiments implemented by any combination of some of the structural elements of the embodiments.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The regulator circuit according to the present disclosure has a feature of being capable of rapidly returning from a non-operating state to an operating state, and is useful as a means for generating an internal power supply voltage of a semiconductor integrated circuit required to have low power consumption, a means for generating a voltage required to perform a readout operation and a write operation of a semiconductor storage device, and the like.

What is claimed is:

1. A regulator circuit that has a first non-operating state, a second non-operating state, and an operating state, the regulator circuit comprising:
  a detection circuit that detects a magnitude of an output voltage of the regulator circuit, and outputs a feedback voltage that indicates a result of the detection to a feedback node;
  an operational amplifier circuit that compares the feedback voltage of the feedback node with a reference voltage, and outputs a voltage that indicates a result of the comparison; and
  an output circuit that generates the output voltage of the regulator circuit according to the voltage output from the operational amplifier circuit, wherein a state of the feedback node is different between the first non-operating state and the second non-operating state, and
a transition time required to switch from the second non-operating state to the operating state is shorter than a transition time required to switch from the first non-operating state to the operating state.

2. The regulator circuit according to claim 1,
wherein the regulator circuit generates the output voltage that corresponds to a high level of a write pulse of a semiconductor storage device that is capable of writing content to be stored into a memory cell and erasing content stored in the memory cell by using an electric signal, and supplies the output voltage of the regulator circuit to at least one write pulse application circuit that applies the write pulse of the semiconductor storage device to the memory cell as a power supply voltage.

3. The regulator circuit according to claim 2,
wherein the regulator circuit enters the operating state a predetermined period before the write pulse of the semiconductor storage device becomes active, and enters the second non-operating state when the write pulse of the semiconductor storage device becomes inactive.

4. The regulator circuit according to claim 1,
wherein an output terminal of the regulator circuit has a predetermined voltage in the first non-operating state, and has a state in which the output voltage of the regulator circuit is held at a high impedance in the second non-operating state.

5. The regulator circuit according to claim 1,
wherein the first non-operating state is a state in which the feedback node is set to a predetermined voltage, and
the second non-operating state is a state in which the feedback node is set to a voltage other than the predetermined voltage, or is set to a high impedance.

6. The regulator circuit according to claim 1, further comprising:
a connection disconnection circuit that switches between connection and disconnection of the detection circuit and the output circuit, or switches between connection and disconnection of the detection circuit and the feedback node;
a first bias circuit that supplies a first bias voltage to the feedback node; and
a second bias circuit that supplies a second bias voltage to the feedback node, the second bias voltage being different from the first bias voltage.

7. The regulator circuit according to claim 6,
wherein the connection disconnection circuit connects the detection circuit and the feedback node in the operating state, and disconnects the detection circuit from the feedback node in the first non-operating state and the second non-operating state,
the first bias circuit and the feedback node are connected in the first non-operating state, and
the second bias circuit and the feedback node are connected in the second non-operating state.

8. The regulator circuit according to claim 6,
wherein a difference between the first bias voltage and the reference voltage is smaller than a difference between the second bias voltage and the reference voltage.

9. The regulator circuit according to claim 6,
wherein the first bias circuit includes a switch that switches between supplying the first bias voltage to the feedback node and not supplying the first bias voltage to the feedback node, and the second bias circuit includes a voltage follower circuit that generates the second bias voltage from the reference voltage.

10. The regulator circuit according to claim 6,
wherein the second bias circuit includes a first current source, a second current source, a current mirror circuit, an NMOS transistor, a PMOS transistor, and a switch,
one terminal of the first current source is connected to an input terminal of the current mirror circuit,
another terminal of the first current source is grounded,
an output terminal of the current mirror circuit is connected to the feedback node and a source terminal of the PMOS transistor,
a gate terminal of the NMOS transistor is connected to the reference voltage,
a source terminal of the NMOS transistor is connected to a power supply voltage,
a drain terminal of the NMOS transistor is connected to a gate terminal of the PMOS transistor and one terminal of the second current source,
another terminal of the second current source is grounded,
a drain terminal of the PMOS transistor is connected to one terminal of the switch, and
another terminal of the switch is grounded.

11. The regulator circuit according to claim 6,
wherein the second bias circuit includes a first current source, a second current source, a current mirror circuit, an NMOS transistor, a PMOS transistor, and a switch,
one terminal of the first current source is connected to an input terminal of the current mirror circuit,
another terminal of the first current source is grounded,
an output terminal of the current mirror circuit is connected to a gate terminal of the NMOS transistor and a source terminal of the PMOS transistor,
a source terminal of the NMOS transistor is connected to a power supply voltage,
a drain terminal of the NMOS transistor is connected to the feedback node and one terminal of the second current source,
another terminal of the second current source is grounded,
a gate terminal of the PMOS transistor is connected to the reference voltage,
a drain terminal of the PMOS transistor is connected to one terminal of the switch, and
another terminal of the switch is grounded.

12. A semiconductor storage device that is capable of erasing data from a memory cell and writing data into the memory cell by using an electric signal, the semiconductor storage device comprising:
the regulator circuit according to claim 1;
the memory cell that stores data; and
a write pulse application circuit that applies a write pulse to the memory cell,
wherein the regulator circuit supplies the output voltage of the regulator circuit that corresponds to a high level of a write pulse to the write pulse application circuit as a power supply voltage.

13. The semiconductor storage device according to claim 12,
wherein the regulator circuit enters the operating state a predetermined period before the write pulse becomes active, and enters the second non-operating state when the write pulse becomes inactive.

14. The semiconductor storage device according to claim 13, wherein, in a plurality of continuous writing operations, the operating state and the second non-operating state are repeated a same number of times.

\* \* \* \* \*